United States Patent [19]

Wasielewski

[11] Patent Number: 4,603,374
[45] Date of Patent: Jul. 29, 1986

[54] PACKAGING MODULE FOR A SEMICONDUCTOR WAFER

[75] Inventor: J. Paul Wasielewski, Scottsdale, Ariz.

[73] Assignee: Motorola, Inc., Schaumburg, Ill.

[21] Appl. No.: 628,020

[22] Filed: Jul. 3, 1984

[51] Int. Cl.⁴ .............................................. H05K 7/20
[52] U.S. Cl. ...................................... 361/389; 357/81; 361/388; 361/395
[58] Field of Search ............... 165/80.2, 80.3, 185; 174/16 HS; 361/386–389, 392, 394, 395, 399; 357/81

[56] References Cited

U.S. PATENT DOCUMENTS 3,675,089  7/1972  Hantusch et al. ............... 357/81
4,000,509  12/1976  Jarvela ............................ 357/81
4,283,754  8/1981  Parks ............................. 361/386

OTHER PUBLICATIONS

McBride, "Multifunction Plug for IC Package", IBM Technical Disclosure Bulletin, vol. 21, No. 9, 2/79, pp. 3594–3595.
Johnson, "Heat Sinks", IBM Technical Disclosure Bulletin, vol. 15, No. 6, 11/72, pp. 1950–1951.

Primary Examiner—A. D. Pellinen
Assistant Examiner—Greg Thompson
Attorney, Agent, or Firm—Vince Ingrassia

[57] ABSTRACT

A package for housing a semiconductor wafer includes a case having a plurality of thermal conductive pads disposed on an inner surface thereof for supporting the wafer. A printed circuit board is equipped with a plurality of contact pins and further includes a plurality of electrically conductive plastic pads which engage contact pads on the wafer when the printed circuit board is disposed on the wafer. The remainder of the cavity within the case is filled with a sealant such as epoxy. If desired, additional electronic components may be positioned on the printed circuit board.

14 Claims, 6 Drawing Figures

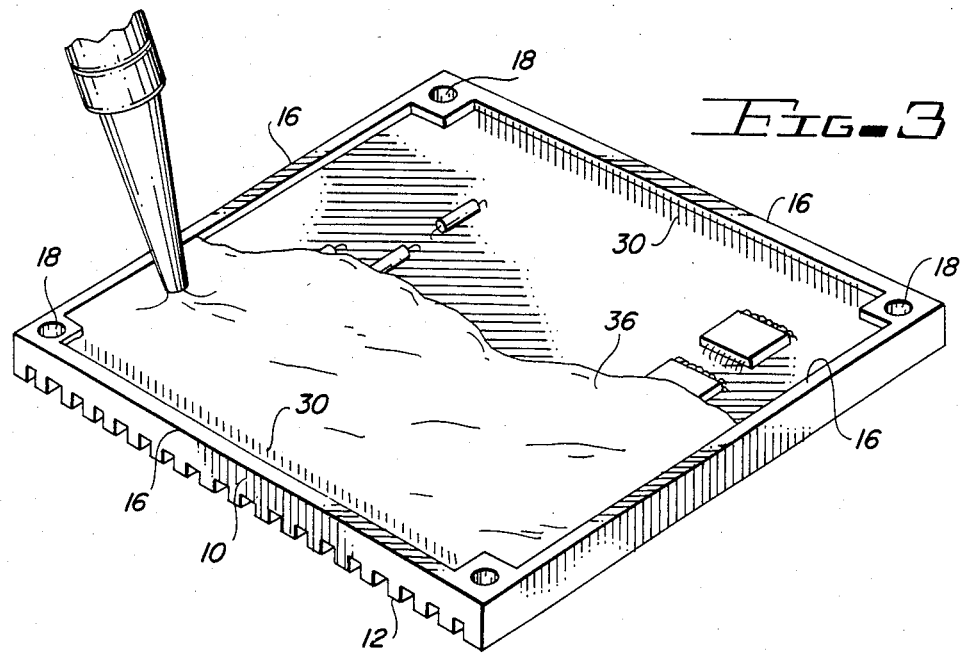
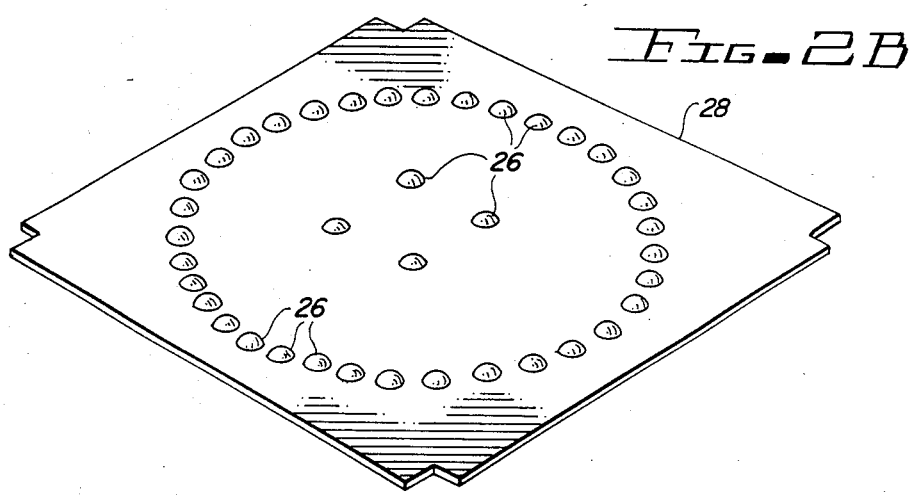

PACKAGING MODULE FOR A SEMICONDUCTOR WAFER

BACKGROUND OF THE INVENTION

This invention relates generally to packaging techniques for integrated circuits and, more particularly, to a package for a semiconductor wafer which permits the wafer to be used in conjunction with a printed circuit board.

Wafer scale integration implies the ability to create an integrated circuit which is large enough to cover the entire surface of a silicon wafer (typically having a diameter of approximately three inches). Instead of being diced into chips, as wafers are for large scale integrated circuits, the wafers are utilized whole or with very marginal trimming. The successful implementation of wafer scale integration requires more than a simple extension of current technology. Specific problems facing Design and System Engineers include, among other things, heat dissipation and packaging.

Until now, wafer scale integration has been utilized only in conjunction with large main frame equipment where weight and space considerations are not critical by companies such as IBM and Trilogy. Not only are the packaging modules associated with main frame uses complex, bulky, and expensive, but they also do not adequately protect the wafer from unwanted shocks, vibrations and other mechanical stresses.

SUMMARY OF THE INVENTION

It is an object of the present invention to provide an improved wafer scale integration module.

It is a further object of the invention to provide an improved package for housing a semiconductor wafer.

It is a still further object of the present invention to provide a package for semiconductor wafers suitable for use in conjunction with printed circuit boards.

It is a still further object of the present invention to provide a wafer scale integration assembly which is simple, occupies relatively little space, and provides adequate shock and vibration protection to the semiconductor wafer.

According to a broad aspect of the invention there is provided a packaging module for housing a semiconductor wafer having a front side and back side with a plurality of contact regions on said front side, comprising; a case having a base, a plurality of thermal conductive pads disposed on said base for supporting said wafer, a printed circuit board equipped with a plurality of contact pins, and a plurality of electrically conductive plastic pads disposed on said printed circuit board and positioned so as to contact said contact regions when said printed circuit board is disposed on said wafer.

According to a further aspect of the invention there is provided a wafer packaging module, comprising a case having a base, a plurality of thermal conductive pads disposed on said base, a semiconductor wafer having a plurality of contact regions thereon disposed within said case on said plurality of thermal conductive pads, a printed circuit board equipped with a plurality of contact pins, and a plurality of electrically conductive plastic pads disposed on said printed circuit board and positioned so as to contact said contact regions when said printed circuit board is disposed on said wafer.

The above and other objects, features and advantages of the present invention will be more clearly understood from the following detailed description taken in conjunction with the accompanying drawings, in which:

BRIEF DESCRIPTION OF THE DRAWINGS

FIGS. 1, 2A, 3, and 4 illustrate the inventive silicon wafer packaging module during various stages of manufacture;

FIG. 2B illustrates a printed circuit board having a plurality of electrically conductive plastic pads thereon;

FIG. 4 is a top partial cut-a-way view of the assembled packaging module; and

DESCRIPTION OF THE PREFERRED EMBODIMENT

Figure 1:
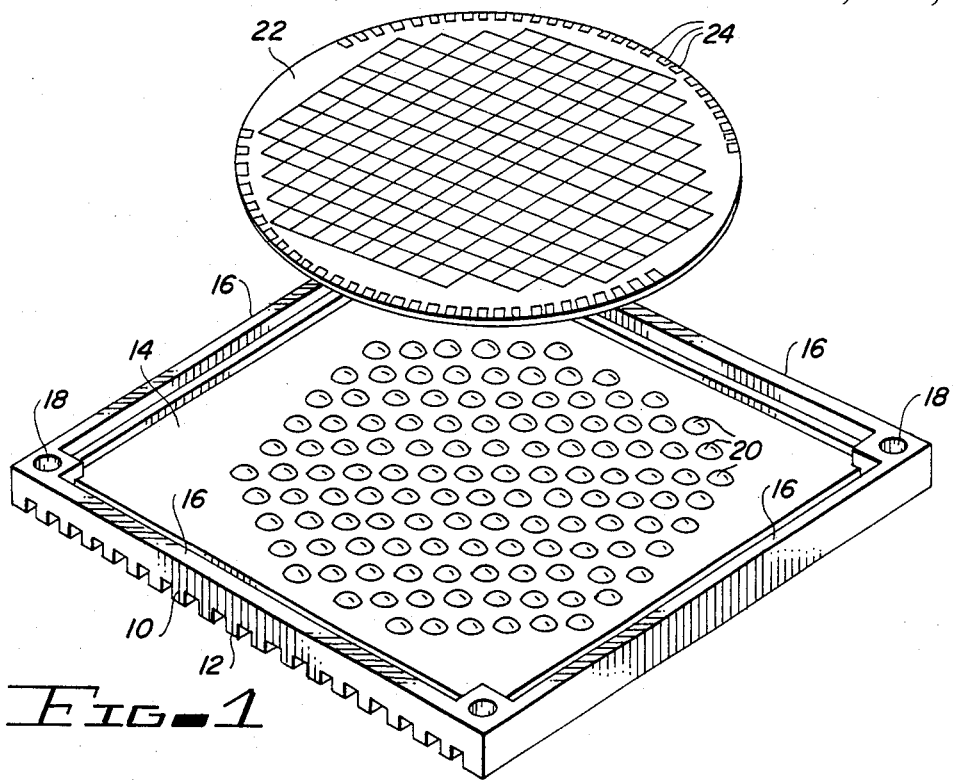

Referring to the several figures as appropriate, the inventive wafer module includes a metal, plastic or ceramic package or case 10 (e.g. a nickel plated copper case) having a serrated periphery 12 to improve heat dissipation and including a base 14 and sidewalls 16 (FIG. 1). Thus, a cavity exists bounded on the bottom by base 14 and on the sides by sidewalls 16. Case 10 is also provided with threaded mounting holes 18 to be utilized in securing the module to a printed circuit board.

Figure 2A:
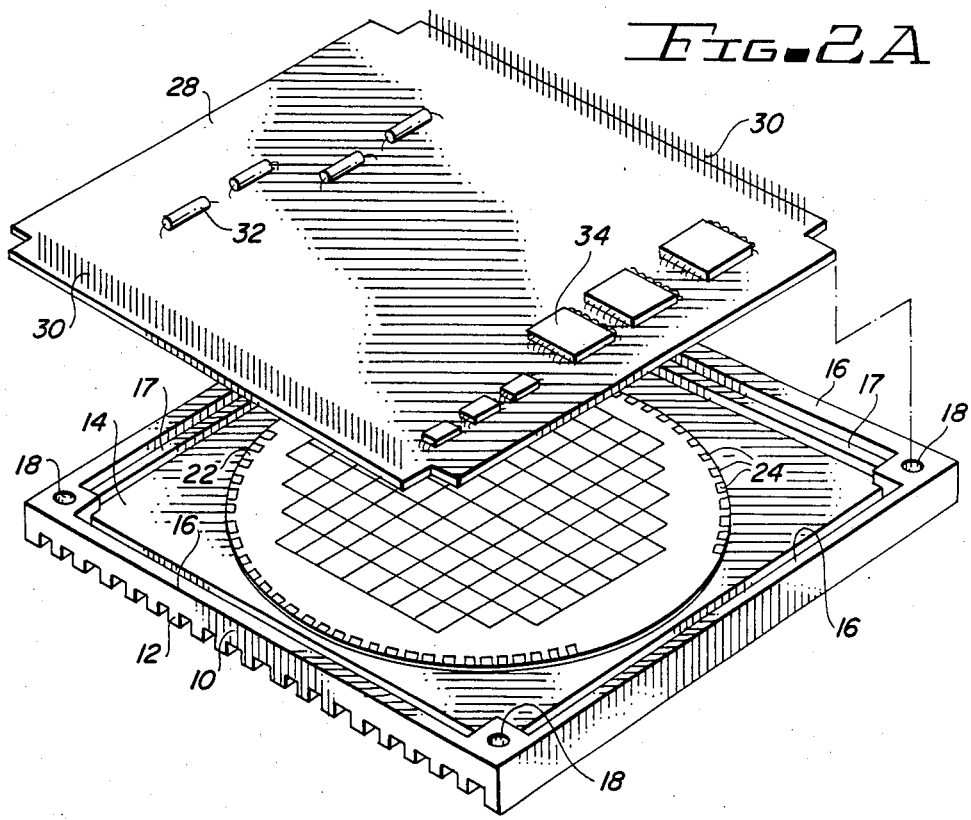
Figure 4:
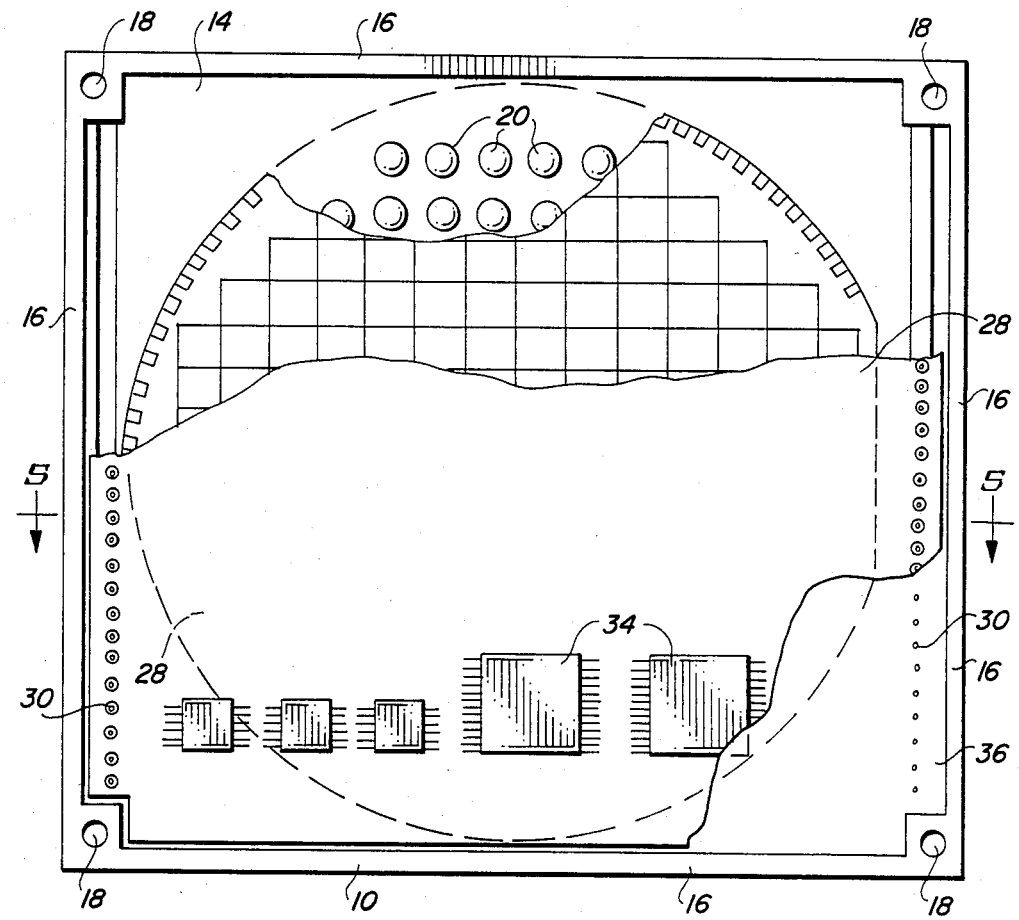
Figure 5:
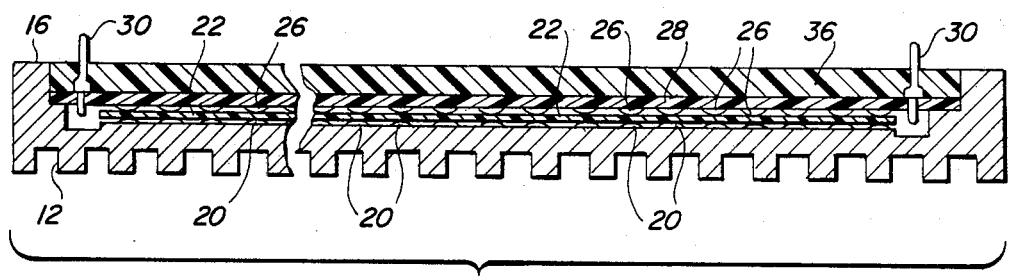
FIG. 5 is a side cross sectional view of the inventive packaging module shown in FIG. 4 taken along line 5—5.

A plurality of thermoconductive plastic (elastomer pads 20 are injected or silk-screened onto base 14, and a semiconductor wafer 22 is urged against the pads which are still sticky. For a wafer approximately 100 millimeters in diameter, approximately 192 elastomer supporting pads will be required. These pads support wafer 22 above base 14 and conduct heat away from the wafer 22 to the outside package 10. Next, the assembly is heated to cure pads 20. As can be seen, wafer 22 includes a plurality of contact pads 24 around the periphery thereof. In order to contact these pads, a plurality of electrically conductive plastic (elastomer) pads 26 are injected or silk-screened onto a polymide printed circuit board 28 which is in turn equipped with a plurality of connector pins 30 (FIG. 2B). Printed circuit board 28 oriented as shown in FIG. 2A is then placed upon wafer 22 such that the pattern of electrically conductive plastic pads 26 matingly engage contact pads 24 on wafer 22. Since the electrically conductive plastic pads 26 are still sticky, printed circuit board 28 will adhere to wafer 22. Board 28 is further secured by adhesive strips 17. The assembly described thus far is then heated again to cure electrically conductive plastic pads 26. If desired, additional circuitry such as discrete components 32 and other integrated circuits 34 may be mounted on printed circuit board 28. Next, the remainder of the case cavity is filled with a sealant such as RTV or epoxy 36 to seal the entire assembly (FIG. 3).

Thus, the inventive wafer module supports a silicon wafer circuit between two resilient mountings. The backside of the wafer is supported by many separate thermal conductive elastomer pads which conduct heat from the wafer to a protective metal, plastic or ceramic package. The device side of the wafer is supported by electrically conductive elastomer pads which electrically connect the wafer to a printed circuit board with external connecting pins. This arrangement protects the large silicon wafer from vibrations and mechanical shock while at the same time permitting for thermal expansion.

The above description is given by way of example only. Changes in form and details may be made by one skilled in the art without departing from the scope of the invention as defined by the appended claims.

I claim:

1. A packaging module which houses a semiconductor wafer having a front side and back side with a plurality of contact regions on said front side, comprising:
   a case having a base;
   a plurality of thermal conductive pads disposed on said base supporting said wafer;
   a printed circuit board equipped with a plurality of contact pins; and
   a plurality of electrically conductive plastic pads disposed on said printed circuit board and positioned so as to contact said contact regions on said printed circuit board disposed on said wafer.

2. A module according to claim 1 wherein said case includes a cavity, of which said base forms a part, for receiving said wafer.

3. A module according to claim 2 wherein said case is metal.

4. A module according to claim 3 wherein said case is nickel plated copper.

5. A module according to claim 2 wherein said case is plastic.

6. A module according to claim 2 wherein said case is ceramic.

7. A module according to claim 2 wherein said thermal conductive pads are plastic.

8. A module according to claim 7 wherein said electrically conductive pads are plastic.

9. A module according to claim 2 further including a body of sealant in said cavity to encase said wafer and said printed circuit board.

10. A module according to claim 9 wherein said sealant is a epoxy.

11. A module according to claim 2 further including adhesive means within said cavity receiving and securing said printed circuit board.

12. A wafer packaging module, comprising:
    a case having a base;
    a plurality of thermal conductive pads disposed on said base;
    a semiconductor wafer having a plurality of contact regions thereon disposed within said case on said plurality of thermal conductive pads;
    a printed circuit board equipped with a plurality of contact pins; and
    a plurality of electrically conductive plastic pads disposed on said printed circuit board and positioned so as to contact said contact regions on said printed circuit board disposed on said wafer.

13. A module according to claim 12 wherein said thermal conductive pads are plastic.

14. A module according to claim 13 wherein said electrically conductive pads are plastic.

* * * * *